United States Patent [19]

Schoepe et al.

[11] Patent Number: 4,856,699
[45] Date of Patent: Aug. 15, 1989

[54] DRIVING MECHANISM FOR A HIGH-SPEED WIRE CONTACTING DEVICE

[75] Inventors: Wolfgang Schoepe; Horst Podeschwa; Wolfgang Knaib; Soachim Gerard of Ddresden, German Democratic Rep.

[73] Assignee: VEB Elektromat Dresden, Dresden, German Democratic Rep.

[21] Appl. No.: 130,051

[22] Filed: Dec. 8, 1987

[30] Foreign Application Priority Data

Mar. 2, 1987 [DD] German Democratic Rep. ............................ 3003535

[51] Int. Cl.⁴ .............................................. B23K 37/02
[52] U.S. Cl. .................................................. 228/4.5
[58] Field of Search ............................. 228/4.5; 219/56.1

[56] References Cited

U.S. PATENT DOCUMENTS

| | | | |
|---|---|---|---|
| 3,894,672 | 7/1975 | Arai et al. | 228/4.5 |
| 4,230,925 | 10/1980 | Lascelles | 228/4.5 |
| 4,445,633 | 5/1984 | Bonham, Jr. | 228/4.5 |
| 4,527,730 | 7/1985 | Shirgi et al. | 228/4.5 |
| 4,603,803 | 8/1986 | Chan et al. | 228/4.5 |
| 4,718,591 | 1/1988 | Hill | 228/4.5 |

FOREIGN PATENT DOCUMENTS

| | | | |
|---|---|---|---|
| 2651124 | 5/1977 | Fed. Rep. of Germany | 228/4.5 |
| 0191042 | 5/1986 | Japan | 228/4.5 |
| 0760505 | 8/1980 | U.S.S.R. | 228/4.5 |

Primary Examiner—Kurt Rowan
Attorney, Agent, or Firm—Jordan and Hamburg

[57] ABSTRACT

The invention relates to a drive mechanism for a wire bonding apparatus for large bonding regions, for connecting to bonding loci by means of wire bridges.

The inventive drive mechanism is comprised of a drive motor (1) coupled to a first angle lever (2) and connected to a bonding head (9) via a bearing (8) in combination with a carrier piece (7), wherein said bonding head (9) is movable in the z-direction in a guide bushing (10). A second angle lever (14) guided by a mechism kinematically dsimilar to those for angle lever (2) is connected to a second drive motor (13) and couples the following three structures to the drive motor: an optical objective (32) vertically movable in a second guide bushing (29), a ratio device (27), and a sliding piece (24) which engages a lever (39) which lever is attached to the generator (12).

With of this arrangement, and particularly with the second drive motor, automatic adjustment of the pivot point of the generator (12), of the objective (32), and of the radio device (27) is achieved. This arrangement thus enables compensation for even large variability in bonding planes.

9 Claims, 3 Drawing Sheets

DRIVING MECHANISM FOR A HIGH-SPEED WIRE CONTACTING DEVICE

BACKGROUND OF THE INVENTION

The invention relates to drive means for a wire bonding apparatus to provide large bonding-plane regions to connect bonding loci via wire bridges, e.g. in connecting component-mounts or the like to the bonding islands of semiconductor chips by means of thermocompression- or thermosonic welding, at the wire ends.

With known apparatuses for wire bonding, the necessary z-direction movement is executed by the entire bonding head, including the generator system and the bonding implement attached thereto, and influenced by vertical guide means. In the present specification, the letters "x", "y" and "z" are used in the same sense as in U.S. Pat. No. 4,445,633, to designate a set of three orthogonal axes, "x" and "y" being in the plane of the workpiece and "z" being at right angles thereto (i.e., vertical). To increase operating speed, in other wire bonding apparatuses the generator system with the bonding element is swingably mounted in the bonding unit, namely in the form of a swingable link (German Democratic Republic Pat. No. 138,121); and the z-direction movement of the bonding implement is executed via a tilting movement of the generator system.

With the first of these solutions, the moving mass is very high, with the entire bonding head being moved, consequently, the bonding head tends to vibrate, thereby severely limiting the reliability of the bond, as well as the operating speed.

In the cases where the bonding implement is swingably mounted in the bonding unit, high operating speed can be achieved due to the lower mass. For reliable bonding, the bonding implement must always approach the bonding plane perpendicularly.ccordingly, the bonding implement must be in a single plane. As a result, the allowable variability in the bonding plane is sharply limited, or else when the bonding plane is changed the lever system must be repositioned. In the automatic high speed wire bonder "Model 1482" of the firm Kulicke and Soffa (USA), for example, the maximum tolerable bonding plane variation is only 0.75 mm. his limits the range of applicability of the apparatus to a few types of components.

SUMMARY OF THE INVENTION

The object of the invention is to attain a wide range of applicability wherein semiconductor components can be fabricated at an economically high speed in situations with substantial differences in elevation between bonding loci on the component mounts and bonding islands on the semiconductor chips, and wherein the operating speed and output of the apparatus are increased, and the bond quality is improved.

The present invention thereby provides drive means for a high speed wire bonding apparatus for large bonding plane regions, wherein bonding loci on component mounts are connected to bonding islands on semiconductor chips in disparate bonding planes, with the bonding implement always being applied exactly perpendicularly so as to avoid unclean bonds or defective bonds, and with optimal operating speed being attainable.

The present invention provides a first drive motor, for the z-movement, provided with a worm drive, coupled to a first angle lever via x-compensating guide means. The angle lever is rotatably and pivotably mounted with respect to the machine frame in a bearing yoke. It is connected to a bonding head having a generator, via a bearing in combination with a carrier piece. The bonding head is movable in the z-direction under the influence of a z-direction guide bushing in which the bonding head is mounted. An optical objective is vertically movable in another guide bushing, as is a radio device in a third guide bushing. A sliding piece interacts with a lever attached to the generator. The objective, radio device, and sliding piece are all coupled to a second drive motor attached to the frame, said coupling being via a second angle lever with similar kinematics to the first angle lever.

The sliding piece serves as a detent for the lever attached to the generator, and represents the followable pivot point of the capillary.

By means of this arrangement, and particularly by means of the second drive motor attached to the frame and the drive lever system associated with said second motor, an automatic following of the pivot point of the generator, of the objective, and of the radio device is achieved. This arrangement enables compensation for even large variability in bonding planes without losses in quality or speed of operation.

According to a refinement of the invention, the generator system, comprised of the generator, a generator support, and a lever attached to the generator, which lever is pivotable and is acted on by a spring and an adjusting screw whereby it is braced against the generator support, is pivotably mounted in a bearing on the bonding head. When the bonding head is moved upward, the lever interacts with a sliding piece which is adjustably movable in the z-direction by means of the second angle lever. A detent is attached to the generator, to oppose the lever. A limiting screw adjustably mounted on the bonding head cooperates with the detent.

A further refinement of the invention is characterized in that the second angle lever, which is pivotable in a corresponding bearing yoke, is coupled on one side to the worm drive of the second drive motor, via an x-compensating guide means, and is coupled on the other side to a drive lever, via a bearing and a carrying piece. This drive lever to which the second lever is coupled is rotatably mounted (via a fixed bearing) on a cross table which is movable in the x- and y-directions. Said drive lever transmits its movement to a first vertically guided bearing bolt, via a first grooved ball bearing. The said drive lever is connected to the lever attached to the generator, via a sliding piece mounted in a bearing, with such connection depending on the vertical position. A second grooved ball bearing, mounted on the drive lever, is connected to a second vertically guided bearing bolt. The radio device with an electrode, and a third vertically guided bearing bolt for carrying the objective, are connected to the second bearing bolt.

BRIEF DESCRIPTION OF THE DRAWING

The invention will be described in detail with the aid of the accompanying drawings.

DETAILED DESCRIPTION OF THE PREFERRED EMBODIMENT

Figure 1:
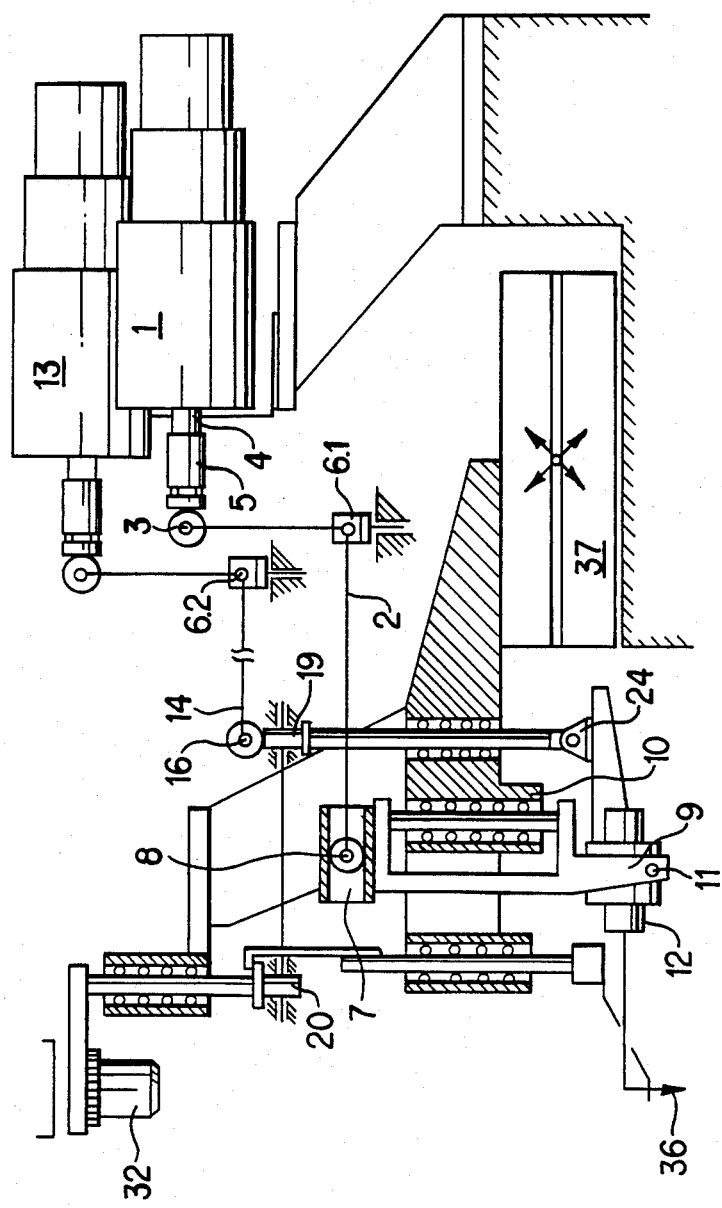
FIG. 1 is a schematic representation of high speed wire bonding apparatus according to the present invention.

The drive means for the bonding head 9 employs a drive motor 1 affixed to a frame, a worm drive 4, and a drive nut with x-compensating guide means 5, whereby each step executed by the drive motor 1 produces a longitudinal movement of approximately 5 microns. The longitudinal movement is transmitted to the bonding head 9 which is mounted in z-direction guide means 10, with a 1:2 ration via an angle lever 2 which is pivotably and swingably mounted with respect to the frame in a bearing yoke 6.1, and further via a bearing 8 and a carrier piece 7. The bonding head 9 bears bearing means for the generator 12 (FIG. 1).

Figure 2:
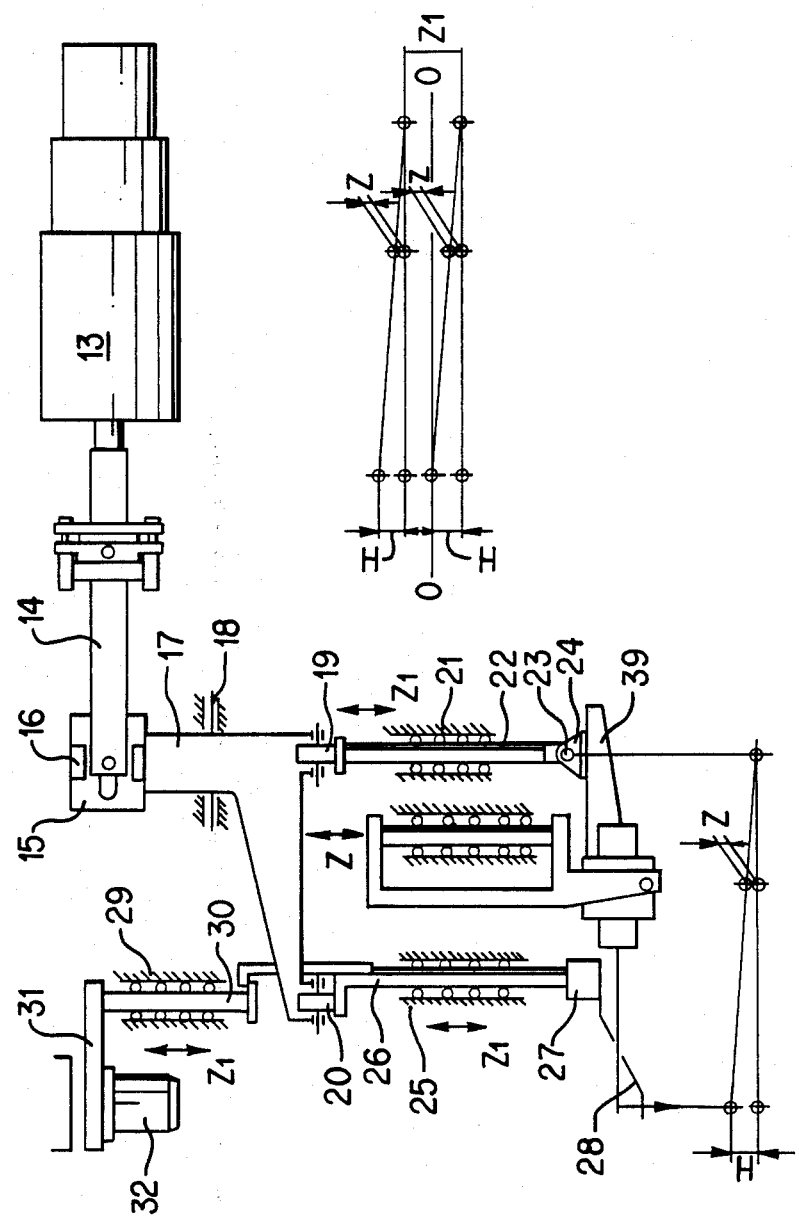
FIG. 2 is a schematic representation of the drive means for the pivot-point system, optical system, and radio communication system.

A second drive motor 13 affixed to the frame has an identical worm drive and identical motor step size as the aforementioned drive means for bonding head 9. The longitudinal movement is likewise transmitted to a drive lever 17, with a 1:2 ratio via an angle lever 14 which is pivotably and swingably mounted with respect to the frame in a bearing yoke 6.2, and further via a bearing 16 and a carrier piece 15. The drive lever 17 is mounted on the x-y-movable cross table 37 by means of a fixed bearing 18, and transmits its movement via a grooved ball bearing 19 to a bearing bolt 22 which is accommodated in a guide bushing 21 for following or adjusting the pivot point and which bears a sliding piece 24 in a bearing 23 (FIG. 2).

A second grooved ball bearing 20 of the drive lever 17 tansmits the movement to a bearing bolt 26 which is accommodated in a guide bushing 25 for adjusting the radio communication system. A vertically adjustably movable radio device 27 with an electrode 28 is attached to the bolt 26.

A bearing bolt 30 is rigidly attached to the bearing bolt 26. Bolt 30 is mounted in a guide bushing 29 for adjusting an optical objective 32 which is vertically adjustable. An objective 32 is attached to bolt 30 via the objective mount 31.

Thus the drive motor 13 moves the pivot-point-, optical-, and radio systems, to provide identical excursions, thereby enabling adjustment to different bonding planes.

Figure 4:
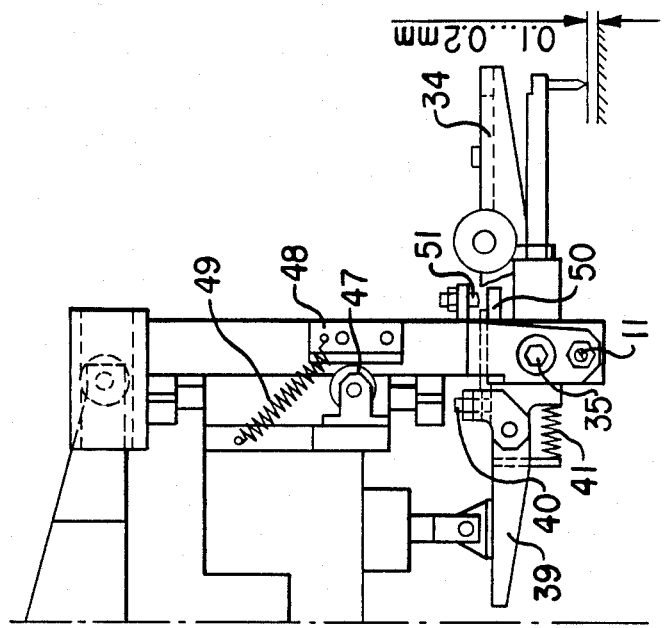
FIG. 4 is the other side view of the bonding head.
Figure 3:
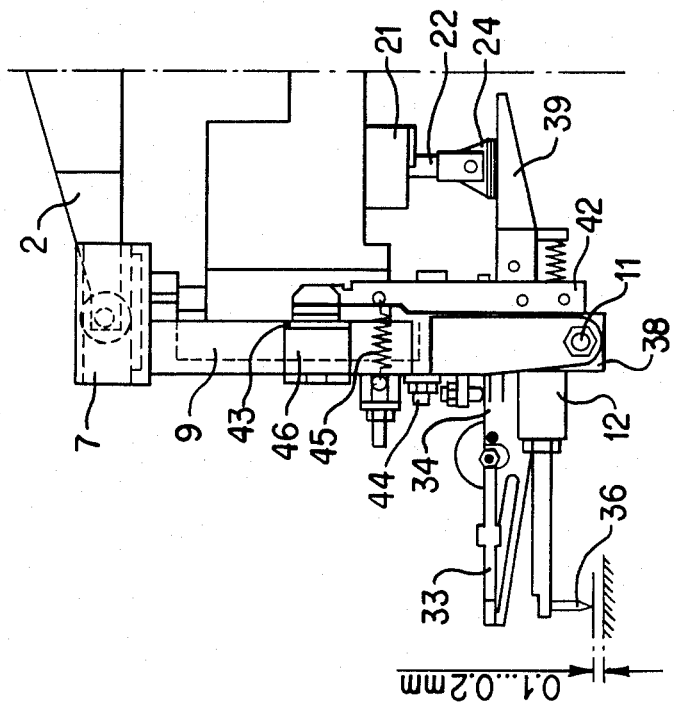
FIG. 3 is a side view of the bonding head.

The bonding head 9 accommodates the generator system in the bearing 11. The generator system is comprised of a generator support 38, the generator 12, and a pivotably mounted lever 39 which is adjustably braced via a spring 41 and an adjusting screw 40. With upward movement of the bonding head 9, if the bonding implement 36 is disposed 0.1 to 0.2 mm above the bonding plane, the lever 39 comes to abut the sliding piece 24 which is mounted on the bearing bolt 22 via a bearing 23 (FIGS. 3 and 4).

In this way, the stroke of the bonding implement 36 is a combination of a purely vertical z-movement of the low-mass bonding head 9 and a swinging movement of the generator 12, wherein the bonding head only moves through one third of the entire excursion. Shortly before the bonding plane is arrived at, the swinging excursion is concluded, wherein the final approach of the bonding implement 36 is purely vertical, to ensure accurate contacting. When the bonding plane is moved, it is followed acccurately by the pivot point of the generator 12, and by the objective 32 and the electrode 28 of the radio device 27.

A lever 42 is attached to an extension on the generator support 38, which lever 42 is pulled, by a spring 45, against a detent screw 44 adjustably attached to the bonding head 9, wherein distally of the spring 45 the lever 42 bears an armature 43 which interacts with a magnet 46 to provide a controllable force of bonding.

The detent screw 44 serves to vertically align the bonding implement 36 with respect to the bonding plane; the adjustable spring 45 provides a basic bonding force. A bearing 47 with a guide strip 48 and a spring 49 serve to provide fixation of the bonding head 9 with respect to rotation in the z-guide bushing 10, wherewith it is further the function of the spring 49 to compensate for the force due to the weight of the bonding head 9.

A detent member 50 on the generator support 38 cooperates with an adjustable detent screw 51 on the bonding head 9 to limit the swinging movement of the generator 12 when the bonding implement 36 is in its base position approximately 5 mm above the bonding plane, in connection with which limitation when the bonding head 9 is moved further above the base position the pivotably mounted lever 39 of the generator support 38 is deflected by coming up against the sliding piece 24.

Also mounted in the bonding head 9 is a wire-pincers holder 34 for wire pincers 33. The holder is centrally mounted on a pivot 35, and bears the wire pincers 33 on one side and on the other side interacts with the sliding piece 24 of the pivot point.

We claim:

1. A drive mechanism for a high speed wire bonding device used to connect bonding loci via wire bridges, said drive mechanism comprising:
    (a) a bonding head including a generator system, a pincer system and a wire drag device;
    (b) z-movement drive motor means affixed to a machine frame for moving said bonding head in a vertical direction;
    (c) first angle lever means rotatably and pivotable mounted with respect to the machine frame and coupled to said bonding head for providing vertical movement to said bonding head;
    (d) x-compensating guide means for coupling said z-movement drive motor means with said first angle lever means;
    (e) bearing yoke means for rotatably and pivotably mounting said first angle lever means with respect to the machine frame;
    (f) bearing and carrier piece means for connecting said first angle lever means with the bonding head;
    (g) first guide bushing means for permitting movement of said bonding head in the vertical direction;
    (h) an optical objective;
    (i) second guide bushing means for permitting vertical movement of said optical objective;
    (j) a radio device;
    (k) third guide bushing means for permitting vertical movement of said radio device;
    (l) a generator lever attached to said generator system;
    (m) a sliding piece which engages said generator lever;
    (n) second drive motor means affixes to the machine frame for providing vertical movement to said optical objective, said radio device and said sliding piece; and
    (o) second angle lever means for coupling said second drive motor means to said optical objective, said radio device and said sliding piece.

2. A drive mechanism according to claim 1; wherein:
(a) said generator system includes:
  (i) a generator attached to said generator lever, and
  (ii) generator support means for supporting said generator;
(b) bearing means for pivotally mounting said generator lever on said generator on the bonding head;
(c) said drive mechanism further includes:
  (i) a spring for biasing said generator lever in a first direction, and
  (ii) adjusting screw means for bracing said generator lever against said generator support means;
(d) a limiting screw adjustably mounted on the bonding head; and
(e) a detent attached to the generator in opposition to the generator lever and cooperating with said limiting screw;
(f) the generator lever interacts with the sliding piece when the bonding head is moved vertically upward; and
(g) said sliding piece is adjustably movable in the vertical direction by said second angle lever means.

3. A drive mechanism according to claim 1; further comprising:
(a) bearing yoke means for pivotally mounting said second angle lever means;
(b) a worm drive of said second drive motor means coupled on one side of said second angle lever means;
(c) second x-compensating guide means for coupling said worm drive of said second drive motor means on said one side of said second angle lever means;
(d) a cross table movable in x- and y-directions;
(e) a fixed bearing on the cross table;
(f) a drive lever rotatably mounted on the cross table by means of said fixed bearing and engageable with the generator lever by means of said sliding piece;
(g) a first vertically guided bearing bolt connected with said sliding piece;
(h) first grooved ball bearing means for connecting said drive lever to said first vertically guided bearing bolt;
(i) second bearing and carrying piece means for coupling the other side of said second angle lever means to said drive lever;
(j) fourth bearing means for mounting said sliding piece;
(k) a second vertically guided bearing bolt connected with the radio device;
(l) said radio device including an electrode;
(m) second grooved ball bearing means for connecting said drive lever to said second vertically guided bearing bolt;
(n) a third vertically guided bearing bolt for connecting said optical objective to said drive lever.

4. A drive mechanism for a high speed wire bonding device used to connect bonding loci via wire bridges, said drive mechanism comprising:
(a) a bonding head including a generator system, a pincer systems and a wire drag device;
(b) z-movement drive motor means affixed to a machine frame for moving said bonding head in a vertical direction;
(c) first angle lever means rotatably and pivotally mounted with respect to the machine frame and coupled to said bonding head for providing vertical movement to said bonding head;
(d) an vertically movable optical objective;
(e) a vertically movable radio device;
(f) a generator lever attached to said generator system;
(g) a sliding piece which engages said generator lever;
(h) second drive motor means affixed to the machine frame for providing vertical movement to said optical objective, said radio device and said sliding piece; and
(i) second angle lever means for coupling said second drive motor means to said optical objective, said radio device and said sliding piece.

5. A drive mechanism according to claim 4, wherein:
(a) said generator system includes:
  (i) a generator attached to said generator lever, and
  (ii) generator support means for supporting said generator;
(b) bearing means for pivotally mounting said generator lever on said generator on the bonding head;
(c) said drive mechanism further includes:
  (i) a spring for biasing said generator lever in a first direction, and
  (ii) adjusting screw means for bracing said generator lever against said generator support means;
(d) a limiting screw adjustably mounted on the bonding head; and
(e) a detent attached to the generator in opposition to the generator lever and cooperating with said limiting screw;
(f) the generator lever interacts with the sliding piece when the bonding head is moved vertically upward; and
(g) said sliding piece is adjustably movable in the vertical direction by said second angle lever means.

6. A drive mechanism according to claim 4; further comprising:
(a) bearing yoke means for pivotally mounting said second angle lever means;
(b) a worm drive of said second drive motor means coupled on one side of said second angle lever means;
(c) x-compensating guide means for coupling said worm drive of said second drive motor means on said one side of said second angle lever means;
(d) a cross table movable in x- and y-directions;
(e) a fixed bearing on the cross table;
(f) a drive lever rotatably mounted on the cross table by means of said fixed bearing and engageable with the generator lever by means of said sliding piece;
(g) a first vertically guided bearing bolt connected with said sliding piece;
(h) first grooved ball bearing means for connecting said drive lever to said first vertically guided bearing bolt;
(i) bearing and carrying piece means for coupling the other side of said second angle lever means to said drive lever;
(j) fourth bearing means for mounting said sliding piece;
(k) a second vertically guided bearing bolt connected with the radio device;
(l) said radio device including an electrode;
(m) second grooved ball bearing means for connecting said drive lever to said second vertically guided bearing bolt;
(n) a third vertically guided bearing bolt for connecting said optical objective to said drive lever.

7. A drive mechanism according to claim 4; further comprising x-compensating guide means for coupling said z-movement drive motor means with said first angle lever means.

8. A drive mechanism according to claim 4; further comprising bearing yoke means for rotatably and pivotably mounting said first angle lever means with respect to the machine frame.

9. A drive mechanism according to claim 4; further comprising bearing and carrier piece means for connecting said first angle lever means with the bonding head.

* * * * *

UNITED STATES PATENT AND TRADEMARK OFFICE
CERTIFICATE OF CORRECTION

PATENT NO. : 4,856,699
DATED : August 15, 1989
INVENTOR(S) : Wolfgang Schoepe.

It is certified that error appears in the above-identified patent and that said Letters Patent is hereby corrected as shown below:

On the title page:

Please correct the inventor information as follows:

[75] Inventors: Wolfgang Schoepe; Horst Podeschwa; Wolfgang Kraiss; Joachim Gerard of Dresden, German Democratic Rep.

Signed and Sealed this

Sixteenth Day of October, 1990

Attest:

HARRY F. MANBECK, JR.

Attesting Officer

Commissioner of Patents and Trademarks